(12) United States Patent
Kamoshida et al.

(10) Patent No.: US 11,244,802 B2
(45) Date of Patent: Feb. 8, 2022

(54) ION MILLING DEVICE AND ION SOURCE ADJUSTING METHOD FOR ION MILLING DEVICE

(71) Applicant: Hitachi High-Tech Corporation, Tokyo (JP)

(72) Inventors: Hitoshi Kamoshida, Tokyo (JP); Hisayuki Takasu, Tokyo (JP); Atsushi Kamino, Tokyo (JP); Toru Iwaya, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/961,759

(22) PCT Filed: Feb. 28, 2018

(86) PCT No.: PCT/JP2018/007477
§ 371 (c)(1),
(2) Date: Jul. 13, 2020

(87) PCT Pub. No.: WO2019/167165
PCT Pub. Date: Sep. 6, 2019

(65) Prior Publication Data
US 2021/0066020 A1  Mar. 4, 2021

(51) Int. Cl.
*H01J 37/08* (2006.01)
*H01J 37/147* (2006.01)
(Continued)

(52) U.S. Cl.
CPC .......... *H01J 37/08* (2013.01); *H01J 37/1472* (2013.01); *H01J 37/20* (2013.01); *H01J 37/244* (2013.01);
(Continued)

(58) Field of Classification Search
CPC ........ H01J 37/08; H01J 37/1472; H01J 37/20; H01J 37/244; H01J 37/305;
(Continued)

(56) References Cited

U.S. PATENT DOCUMENTS 4,128,765 A * 12/1978 Franks ...................... G01N 1/32
204/192.34
2006/0145095 A1 * 7/2006 Olson .................. H01J 37/3171
250/492.21

(Continued)

FOREIGN PATENT DOCUMENTS

JP  62-143351 A  6/1987
JP  1-142149 U  9/1989
(Continued)

OTHER PUBLICATIONS

Japanese-language Office Action issued in Japanese Application No. 2020-503158 dated Apr. 27, 2021 with English translation (nine (9) pages).

(Continued)

*Primary Examiner* — David A Vanore
(74) *Attorney, Agent, or Firm* — Crowell & Moring LLP

(57) ABSTRACT

By irradiating a sample with an unfocused ion beam, processing accuracy of an ion milling device for processing a sample or reproducibility accuracy of a shape of a processed surface is improved. Therefore, the ion milling device includes a sample chamber, an ion source position adjustment mechanism provided at the sample chamber, an ion source attached to the sample chamber via the ion source position adjustment mechanism and configured to emit an ion beam, and a sample stage configured to rotate around a rotation center. When a direction in which the rotation center extends when an ion beam center of the ion beam matches the rotation center is set as a Z direction, and a plane perpendicular to the Z direction is set as an XY plane, the ion
(Continued)

source position adjustment mechanism is capable of adjusting a position of the ion source on the XY plane and a position of the ion source in the Z direction.

15 Claims, 7 Drawing Sheets

(51) Int. Cl.
   *H01J 37/20* (2006.01)
   *H01J 37/244* (2006.01)
   *H01J 37/305* (2006.01)

(52) U.S. Cl.
   CPC ..... *H01J 37/305* (2013.01); *H01J 2237/1502* (2013.01); *H01J 2237/20214* (2013.01); *H01J 2237/24564* (2013.01)

(58) Field of Classification Search
   CPC ..... H01J 2237/1502; H01J 2237/20214; H01J 2237/24564; H01J 37/3045; H01J 2237/30472; H01J 37/243; H01J 37/31; H01J 37/04; H01J 37/067; H01J 37/3056
   See application file for complete search history.

(56) References Cited

U.S. PATENT DOCUMENTS

| | | | | |
|---|---|---|---|---|
| 2008/0202920 | A1* | 8/2008 | Iwaya | H01J 37/3053 204/192.34 |
| 2013/0220806 | A1* | 8/2013 | Iwaya | H01J 37/20 204/298.32 |
| 2014/0014497 | A1* | 1/2014 | Druz | C23C 14/14 204/192.11 |
| 2015/0008121 | A1* | 1/2015 | Kamino | H01J 37/3056 204/298.36 |
| 2016/0155602 | A1* | 6/2016 | Kamino | H01J 37/08 204/192.34 |
| 2017/0138725 | A1* | 5/2017 | Kawada | G01B 15/04 |
| 2018/0286633 | A1* | 10/2018 | Asai | H01J 37/305 |
| 2020/0176214 | A1* | 6/2020 | Pearson | H01J 37/3053 |
| 2021/0066020 | A1* | 3/2021 | Kamoshida | H01J 37/1472 |
| 2021/0183615 | A1* | 6/2021 | Kamoshida | H01J 37/304 |
| 2021/0193430 | A1* | 6/2021 | Iwaya | H01J 37/20 |

FOREIGN PATENT DOCUMENTS

| | | |
|---|---|---|
| JP | 2-112138 A | 4/1990 |
| JP | 3-29249 A | 2/1991 |
| JP | 4-87155 U | 7/1992 |
| JP | 10-134746 A | 5/1998 |
| JP | 2007-18921 A | 1/2007 |
| JP | 2007-57486 A | 3/2007 |
| JP | 2008-91221 A | 4/2008 |
| JP | 2008-204905 A | 9/2008 |
| JP | 2017-199554 A1 | 11/2017 |
| WO | WO 2016/002341 A1 | 1/2016 |
| WO | WO 2018/003109 A1 | 1/2018 |

OTHER PUBLICATIONS

International Search Report (PCT/ISA/210) issued in PCT Application No. PCT/JP2018/007477 dated May 29, 2018 with English translation (10 pages).

Japanese-language Written Opinion (PCT/ISA/237) issued in PCT Application No. PCT/JP2018/007477 dated May 29, 2018 (seven (7) pages).

\* cited by examiner

[FIG. 1]
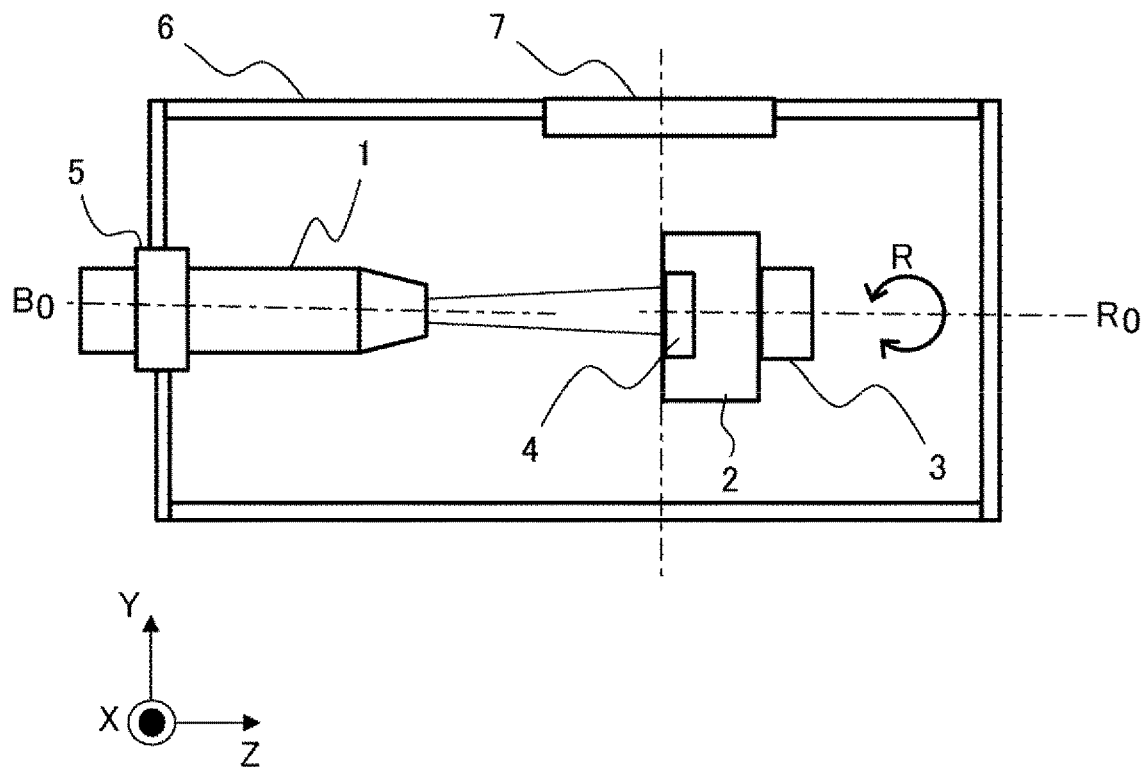
[FIG. 2A]
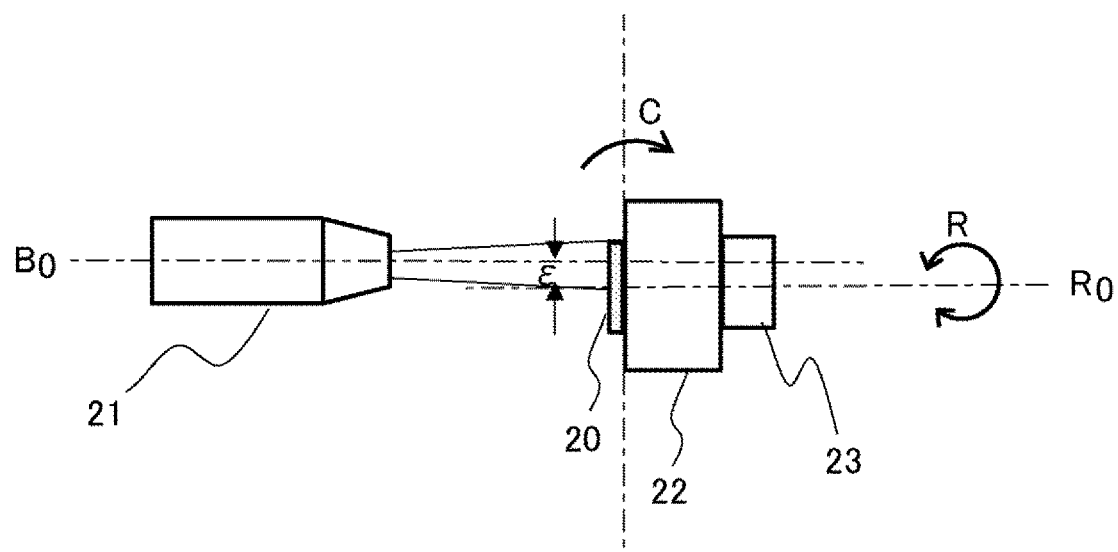

[FIG. 2B]
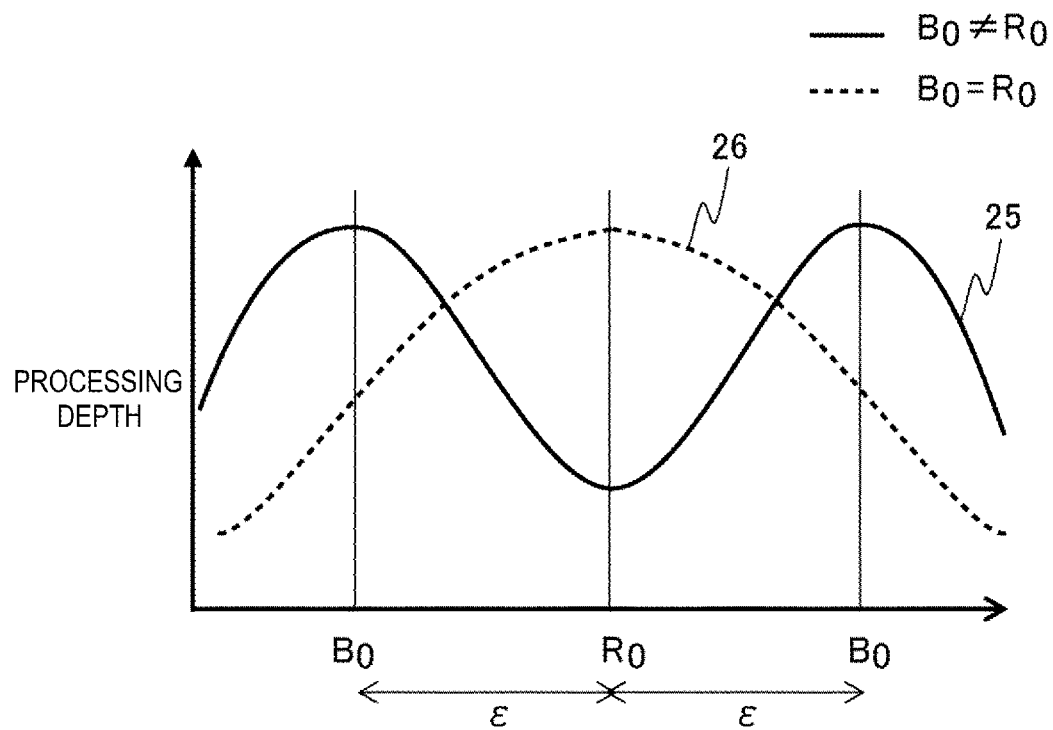
[FIG. 3]
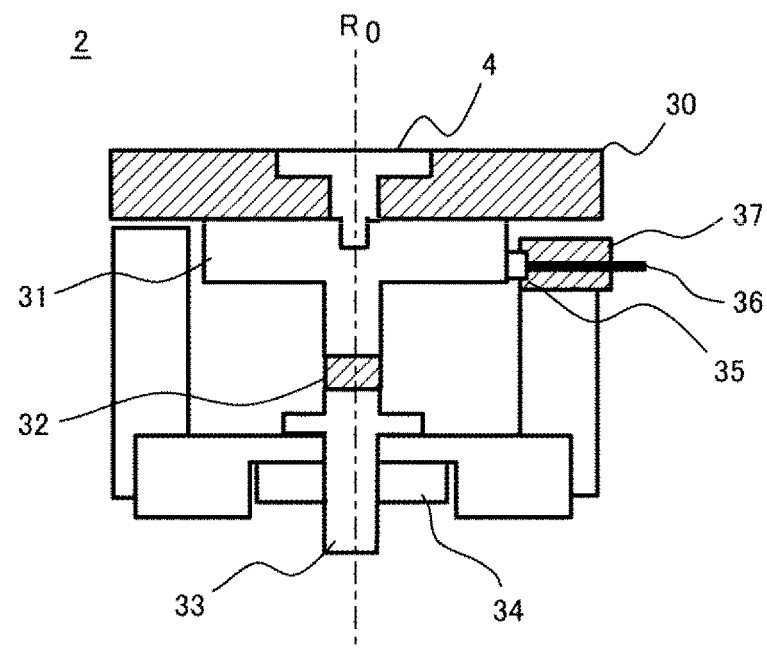

[FIG. 4]
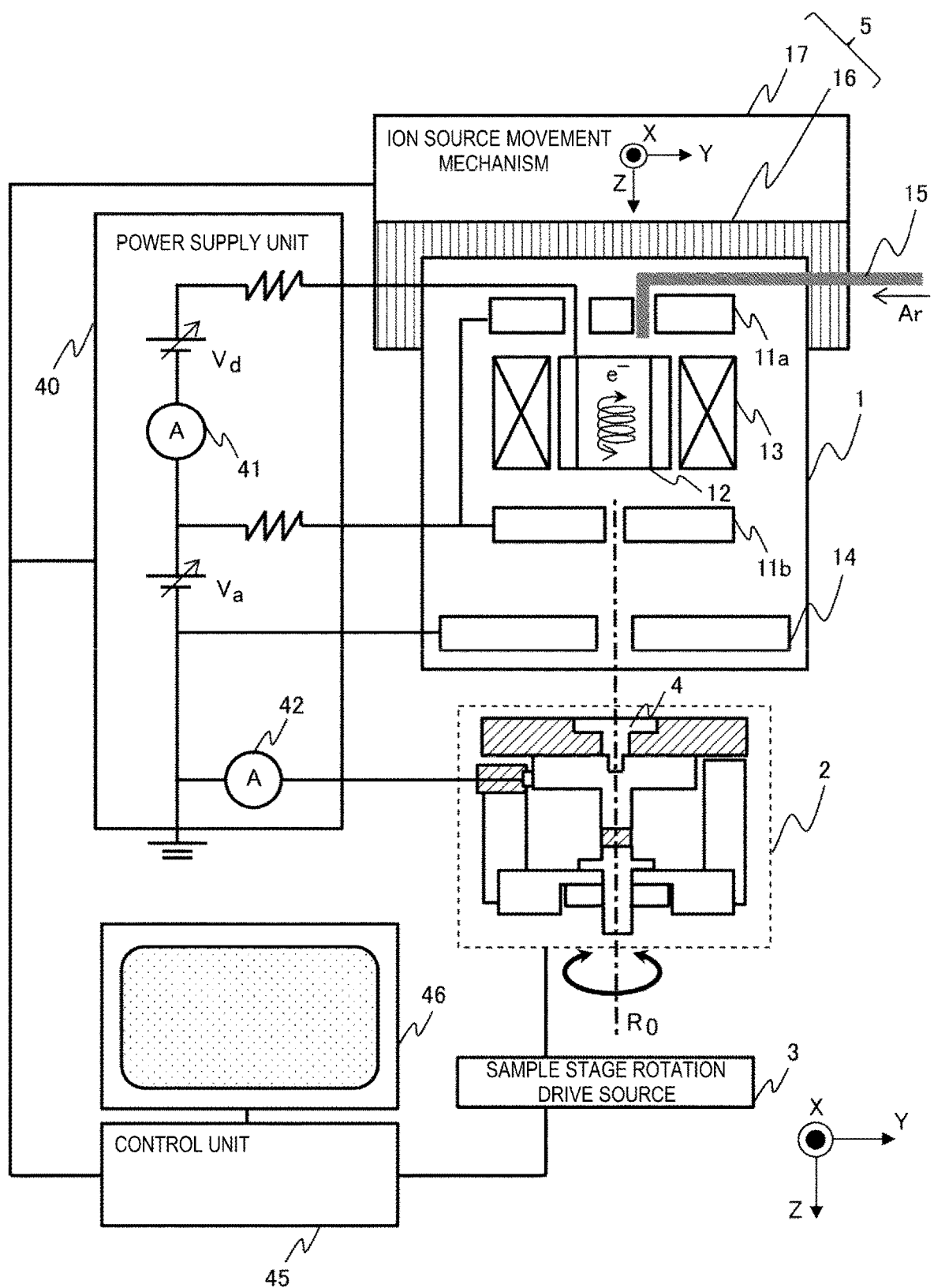

[FIG. 5]
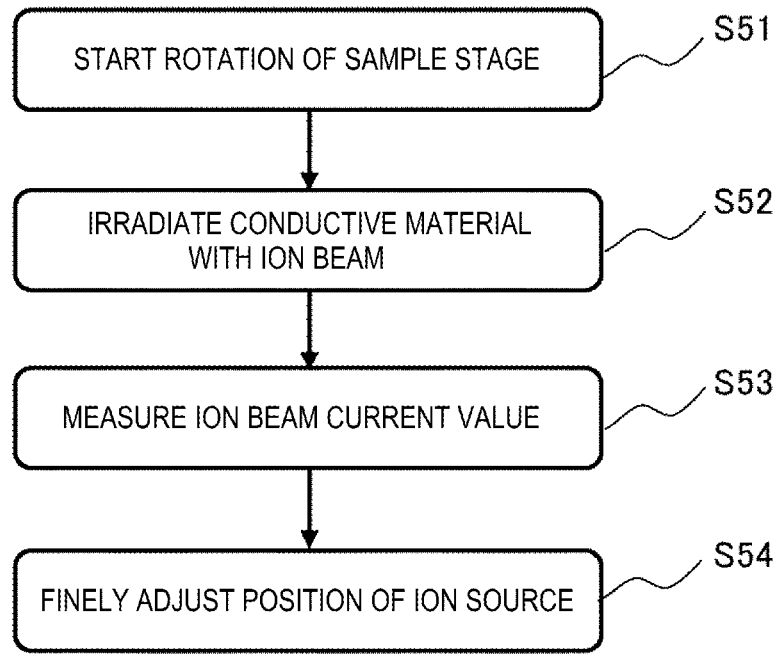
[FIG. 6A]
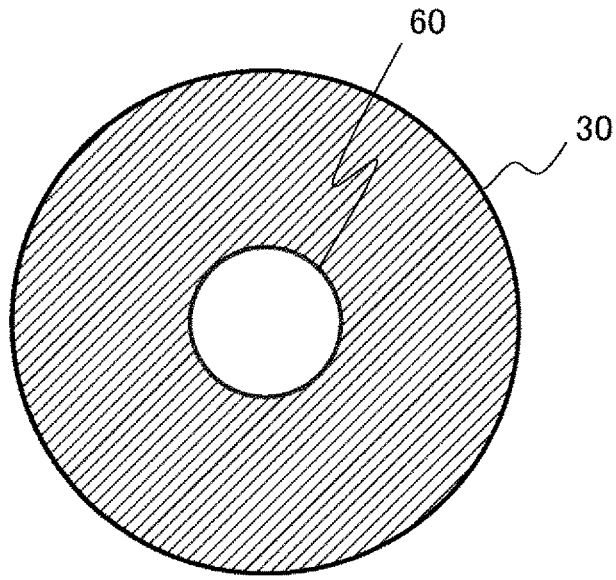

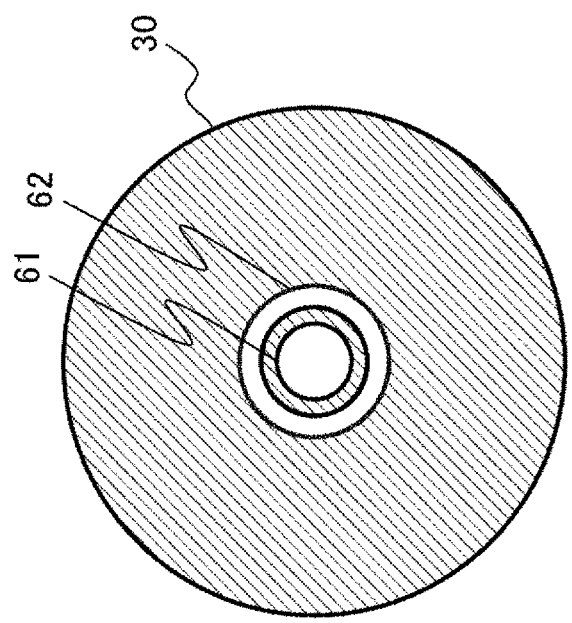
[FIG. 6B]

[FIG. 7]
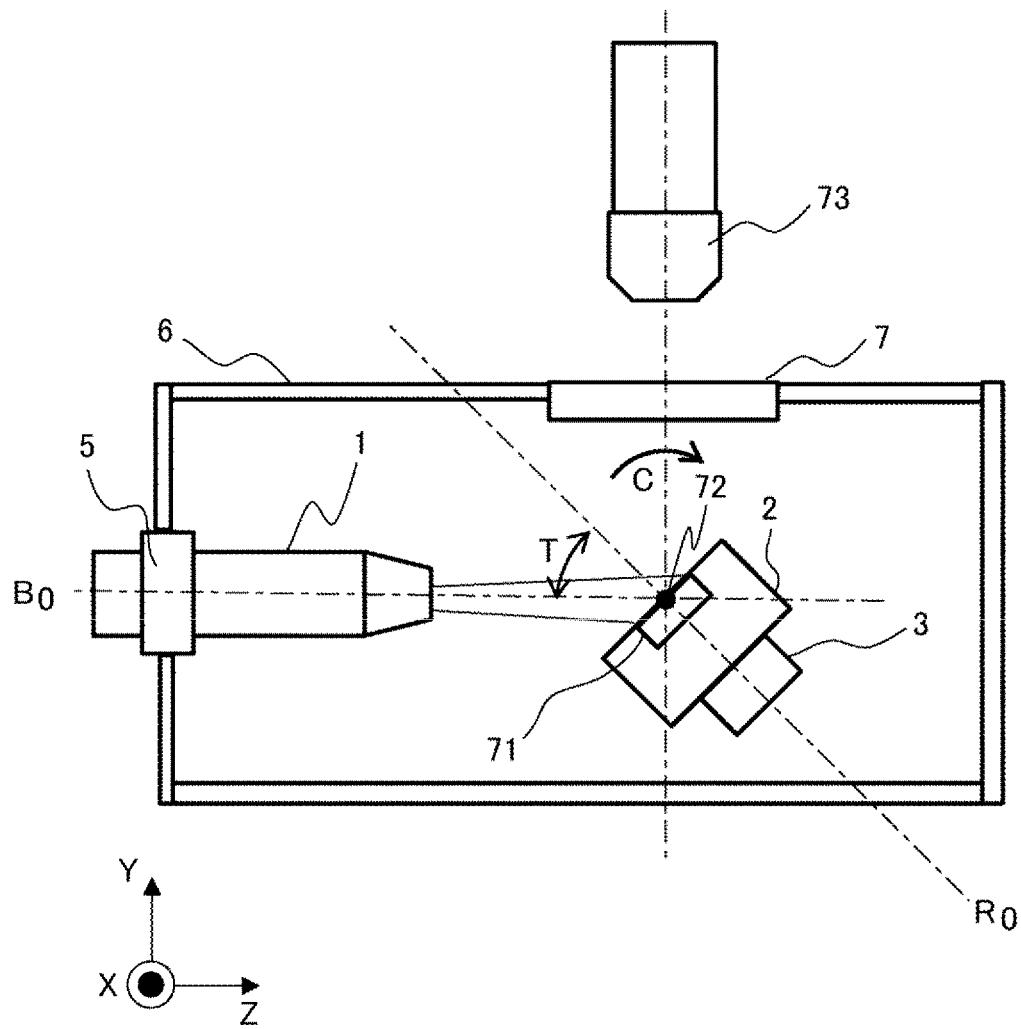

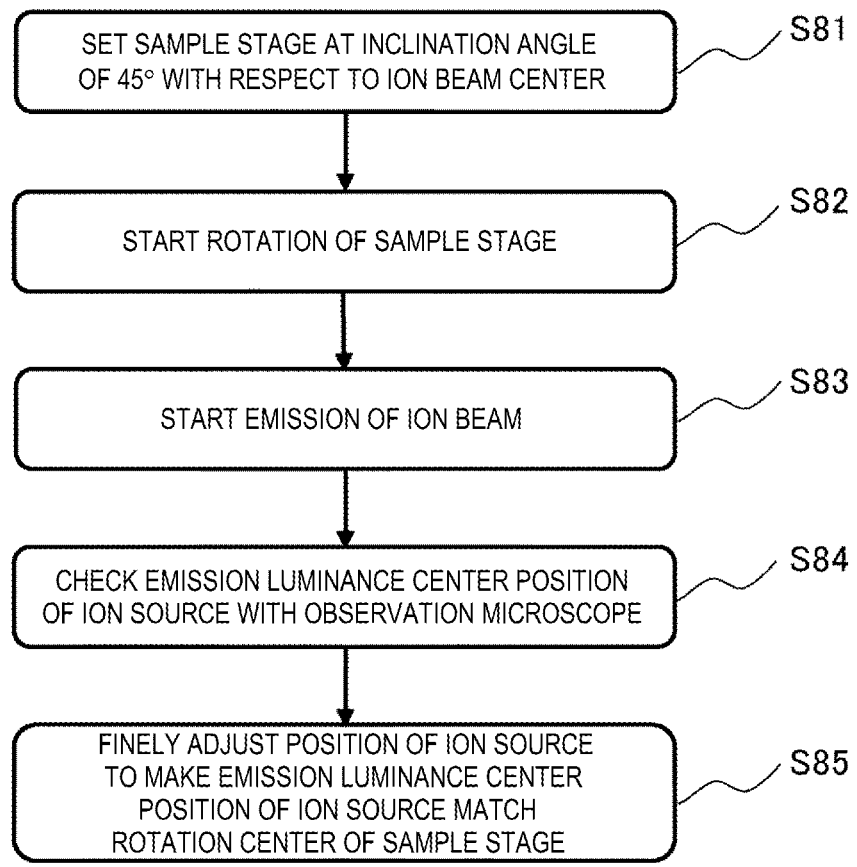
[FIG. 8]

ION MILLING DEVICE AND ION SOURCE ADJUSTING METHOD FOR ION MILLING DEVICE

TECHNICAL FIELD

The present invention relates to an ion milling device and an ion source adjusting method for the ion milling device.

BACKGROUND ART

In order to observe and analyze an internal structure of a sample, it is necessary to expose a target internal structure to a surface. In the related art, there are methods of preparing the sample by cutting or mechanical polishing, but these methods cannot avoid deformation or damage caused by applying a physical pressure to the sample. An ion milling device can irradiate a surface or a cross section of a sample (for example, metal, semiconductor, glass, or ceramic) with an unfocused argon ion beam accelerated to, for example, several kilovolts, and sputters off an atom on the sample surface without stress by a sputtering phenomenon to smooth the sample surface. This is an excellent property for performing smooth processing for observing the surface or the cross section of the sample with an electron microscope represented by a scanning electron microscope (SEM) or a transmission electron microscope (TEM).

In the ion milling device, since the sample is to be processed in a vacuum atmosphere, an ion beam irradiation unit that generates an ion beam is attached to a vacuum container. When the sample is processed, minute particles derived from the sample and generated from a processed surface are adhered to the ion beam irradiation unit, and therefore the ion milling device needs to be periodically cleaned. Therefore, the ion beam irradiation unit is removed from the vacuum container and is again attached thereto after maintenance. However, there is a possibility that when the ion beam irradiation unit is attached again, an attaching error occurs in the ion beam irradiation unit, and an irradiation direction of the ion beam emitted from the ion beam irradiation unit is changed from a previous one.

PTL 1 discloses an ion beam irradiation device in which a sample (herein, substrate) is held by a substrate holder and is reciprocated to cross an irradiation region of an ion beam, and an ion beam irradiation unit irradiates the substrate with the ion beam. To solve the problem described above, an ion beam measurement mechanism for measuring a beam current density distribution of the emitted ion beam is provided on a vacuum container wall surface facing the ion beam irradiation unit. By measuring an ion beam center position by the ion beam measurement mechanism and setting a stroke center position of the reciprocating motion of the substrate to the ion beam center position or a predetermined position determined based on the position, uniformity of an ion irradiation amount on the substrate is ensured even if the attaching error occurs in the ion beam irradiation unit.

On the other hand, in order to dramatically increase an integration degree in a semiconductor device in recent years, a semiconductor device in which a pattern having a minute three-dimensional structure is three-dimensionally integrated has been developed. In order to manage manufacturing of the device in which such a three-dimensional structure pattern is integrated, it is necessary to evaluate the pattern in a cross-sectional direction. PTL 2 discloses that in order to implement measurement with high precision in a depth direction (or a height direction) of such a three-dimensional structure pattern, an inclined surface is formed on a sample surface, and measurement in the depth direction (height direction) of the pattern is performed.

CITATION LIST

Patent Literature

PTL 1: JP-A-2017-199554
PTL 2: WO 2016/002341

SUMMARY OF INVENTION

Technical Problem

In PTL 2, a focused ion beam (FIB) device is used to form the inclined surface for exposing the cross section of the three-dimensional structure pattern on the sample surface. However, since the focused ion beam device has a low processing speed and a narrow processing range, it takes time to form a target inclined surface on the sample surface. Therefore, the inventors have studied forming the inclined surface with the ion milling device using the unfocused ion beam with a high processing speed.

When the unfocused ion beam is used for processing the sample, the processing speed thereof depends on intensity of the ion beam emitted on the sample, specifically a speed of the ion and the number of the ion applied at an accelerating voltage, and an irradiation angle of the ion. Herein, it is considered that the intensity of the ion beam emitted from the ion source ideally has a binomial distribution shape in which the intensity at the ion beam center is the highest and gradually decreases toward a periphery. However, the ion beam emitted from the ion source is influenced by contamination of an electrode component that constitutes the ion source, fluctuation in the number of ions generated due to consumption of the electrode component, or disturbance such as an electric field in environment, and it is difficult to keep the intensity of the ion beam emitted on the sample constant. Further, since an irregularity is formed due to differences in milling speed caused by composition of the sample and an incident angle, when the sample is irradiated with the unfocused ion beam and processed, in the ion milling device, by emitting the ion beam while rotating the sample around the ion beam center, it is possible to control the formation of the irregularity, and to obtain a smooth processed surface suitable for observation and measurement with the electron microscope.

A technical problem of the invention will be described. FIG. 2A shows main parts of the ion milling device. The ion milling device includes an ion source 21, a sample stage 22 on which a sample 20 is placed, and a sample stage rotation drive source 23 that rotates the sample stage 22 about a rotation center $R_0$ in an R direction. An ion beam from the ion source 21 is emitted on the sample 20 placed on a sample placing surface of the sample stage 22 in a state of being spread radially around an ion beam center $B_0$. Originally, it is assumed that the rotation center $R_0$ matches the ion beam center $B_0$, but as shown in FIG. 2A, due to an attaching error of the ion source 21, the rotation center $R_0$ and the ion beam center $B_0$ may be shifted by $\varepsilon$. At this time, a processing depth formed in a surface of the sample 20 is shown in FIG. 2B. As shown in a waveform 25, the processing depth is the deepest at the ion beam center $B_0$ at which the ion beam intensity is the highest, which is a position shifted from the rotation center $R_0$ by $\varepsilon$, and the processing depth decreases as a distance from the ion beam center $B_0$ increases. In contrast, a processing depth when the rotation center $R_0$ matches the ion beam center $B_0$ is shown as a waveform 26. In this way, it can be seen that a shape of the processed surface is gentler than that of an originally intended processed surface due to the attaching error of the ion source 21, and in an extreme case, the processed surface undulates as shown in the waveform 25 of FIG. 2B. Particularly, when it is intended to form an observation surface or the inclined surface on the sample in order to observe or measure the minute three-dimensional structure pattern, such a change in the shape of the processed surface cannot be ignored.

In the example of FIG. 2A, the ion beam is emitted such that the ion beam center $B_0$ is perpendicular to the surface of the sample 20 (or the sample placing surface of the sample stage 22), whereas the sample stage 22 may be inclined in a C direction such that the surface of the sample 20 is irradiated with the ion beam at a low emission angle. Accordingly, a wide processed surface may be obtained. In this case, since the sample stage 22 is rotated about the rotation center $R_0$ in an inclined state and the sample 20 is irradiated with the ion beam, when the rotation center $R_0$ is shifted from the ion beam center $B_0$ (on the surface of the sample 20, the rotation center $R_0$ does not intersect with the ion beam center $B_0$), similarly, the shift between the rotation center $R_0$ and the ion beam center $B_0$ appears as a change in the shape of the processed surface, and the desired observation surface or inclined surface may not be obtained.

When adopting a configuration in which the ion source is directly attached to the vacuum container as in the device in the related art, it is necessary to make the ion source detachable for periodic cleaning, and a machining tolerance between the ion source and an ion source mounting unit of the sample chamber cannot be set to zero. Therefore, it is not possible to prevent the shift from occurring when the ion source is attached again. As described with reference to FIGS. 2A and 2B, the shift leads to a variation in processing accuracy of the ion milling device and a decrease in reproducibility of the shape of the processed surface.

Further, as a distance of the ion beam from an emission port of the ion source increases, a diameter of the ion beam increases, and a current and an ion density decreases. Therefore, it is considered that when an ion beam measurement position is far from an actual sample processing position as in PTL 1, a voltage applied to the ion source for measuring the ion beam must be measured higher than a condition when actual processing is performed. However, when an emission condition of the ion beam changes, energy of the ion beam changes, so that a milling speed changes, ion density distribution also changes, and an influence caused by the disturbance also changes. Therefore, adjustment is preferably performed under the same condition as the emission condition when the actual processing is performed. Therefore, in order to perform the position adjustment under the emission condition when the actual processing is performed, an operator of the ion milling device may perform position adjustment of the ion source such that a processing object such as a copper foil is attached on the sample stage, the ion beam under the actual processing condition is emitted and a beam mark remains on the copper foil to make the beam mark match the rotation center $R_0$. However, the adjustment under visual or microscopic observation with such a beam mark has limited accuracy, it is often necessary to repeat detachment of the ion source many times to perform positioning, and adjustment burden on the operator is large due to lack of real-time capability.

In view of such a technical problem, the invention provides an ion milling device and an ion source adjusting method capable of easily and accurately adjusting an ion beam center and a sample rotation center after detachment of an ion source.

Solution to Problem

An ion milling device according to an embodiment of the invention is an ion milling device configured to process a sample by irradiating the sample with an unfocused ion beam, and includes a sample chamber, an ion source position adjustment mechanism provided at the sample chamber, an ion source attached to the sample chamber via the ion source position adjustment mechanism and configured to emit the ion beam, and a sample stage configured to rotate around an rotation center. When a direction in which the rotation center extends when an ion beam center of the ion beam matches the rotation center is set as a Z direction, and a plane perpendicular to the Z direction is set as an XY plane, the ion source position adjustment mechanism is capable of adjusting a position of the ion source on the XY plane and a position of the ion source in the Z direction.

Other technical problems and novel characteristics will become apparent from a description of the description and the accompanying drawings.

Advantageous Effect

It is possible to improve processing accuracy of the ion milling device or reproducibility accuracy of a shape of a processed surface. Further, it is possible to reduce maintenance time of the ion milling device.

BRIEF DESCRIPTION OF DRAWINGS

FIG. 1 is a configuration diagram of main parts of an ion milling device according to a first embodiment.

FIG. 2A is a diagram showing a technical problem of the invention.

FIG. 2B is a diagram showing the technical problem of the invention.

FIG. 3 is a diagram showing a configuration example of a sample stage.

FIG. 4 is a block diagram relating to position adjustment of an ion source.

FIG. 5 is a position adjustment flow of the ion source according to the first embodiment.

FIG. 6A is an example of a shape of a conductor in a target plate.

FIG. 6B is another example of the shape of the conductor in the target plate.

FIG. 7 is a configuration diagram of main parts of an ion milling device according to a second embodiment.

FIG. 8 is a position adjustment flow of an ion source according to the second embodiment.

DESCRIPTION OF EMBODIMENTS

Embodiments of the invention will be described below with reference to the drawings.

First Embodiment

FIG. 1 is a configuration diagram of main parts of an ion milling device according to a first embodiment. The ion milling device includes a sample chamber 6 capable of maintaining a vacuum state, an ion source 1, a sample stage 2 on which a sample (not shown) is provided during processing, and a sample stage rotation drive source 3 that rotates the sample stage 2 about a rotation center $R_0$ in an R direction. As shown in FIG. 2A, the sample stage 2 may include an inclining mechanism for changing an incident angle of an ion beam. Further, the sample chamber 6 is provided with an observation window 7 for observing a sample to be processed.

Herein, the ion source 1 is attached to the sample chamber 6 via an ion source position adjustment mechanism 5 that finely adjusts a position of the ion source in an X direction, a Y direction, and a Z direction. Accordingly, a position of an ion beam center $B_0$ of the ion source 1, specifically, a position on an XY plane (a plane including the X direction and the Y direction) and an operating distance (refers to a position in the Z direction, specifically, a distance from an ion beam emission position of the ion source 1 to the sample stage 2) can be finely adjusted. Further, as to be described later, a sample placing plate of the sample stage 2 can be replaced, and when the position of the ion source 1 is adjusted, a target plate in which a conductive material 4 for detecting a current of the ion beam is provided in a range including a rotation center $R_0$ is provided instead of the sample placing plate. FIG. 1 shows this state.

The ion source position adjustment mechanism 5 includes a support unit that fixes the ion source 1, a substrate on which the ion source position adjustment mechanism 5 is provided at the sample chamber 6, and an ion source movement mechanism that can independently move the support unit provided on the substrate in the X direction, the Y direction, and the Z direction. By using, for example, a precise screw mechanism used in a micrometer as the ion source movement mechanism, the position of the ion source 1 can be finely adjusted in each direction.

When a predetermined voltage is applied to the ion source 1, the ion beam is emitted from the ion source 1 radially around the ion beam center $B_0$, and is emitted to the target plate which is provided on the sample stage 2 and is provided with the conductive material 4 in the range including the rotation center $R_0$. The ion beam emitted from the ion source 1 has a high current and a high ion density at the ion beam center $B_0$, and the current and the ion density gradually decrease toward an outside. Further, the longer the distance from the ion source 1, the lower the current and the ion density. Therefore, by detecting an ion beam current using the conductive material 4 and finely adjusting the position of the ion source 1 by the ion source position adjustment mechanism 5 to obtain a desired magnitude of the ion beam current, desired processing accuracy or reproducibility accuracy of a shape of a processed surface can be achieved.

FIG. 3 shows a configuration example of the sample stage 2. A state where a target plate 30 provided with the conductive material 4 is provided is shown. The target plate 30 is provided such that the conductive material 4 is connected to a conductive material connection plate 31. At this time, a center of the conductive material 4 is located at a position matching the rotation center $R_0$ shown by a dashed line. The ion beam from the ion source is emitted to a region centered on the conductive material 4. However, since the ion beam is radially emitted from the ion source 1, depending on a distance between the ion source 1 and the conductive material 4, there is a possibility that the ion beam may be emitted to a region other than the conductive material 4. In this case, in order to prevent a current from flowing into the conductive material 4 due to the emission of the ion beam to other components of the sample stage, the target plate 30 around the conductive material 4 is made to be an insulating material. The conductive material connection plate 31 is connected to a rotating shaft 33 that rotates the sample, and the conductive material 4 is rotated by a power of a rotating gear 34 driven by the sample stage rotation drive source 3. However, in order to prevent a current received by the conductive material 4 from flowing into the rotating shaft 33, an insulating material 32 is provided between the conductive material connection plate 31 and the rotating shaft 33 to block the flow of the current. Further, the current received by the conductive material 4 is extracted by a rotation contact 35 in contact with the conductive material connection plate 31 and a beam current detection wire 36, and a current value is detected. The rotation contact 35 and the beam current detection wire 36 are insulated from other components by a beam current detection wiring connector 37.

FIG. 4 is a block diagram relating to the position adjustment of the ion source 1 in the ion milling device according to the first embodiment. Although the invention is not particularly limited, herein, an example is shown in which an ion source caused by Penning discharge is used as the ion source 1. A cylindrical anode electrode 12 is disposed between cathode electrodes 11a and 11b, and a discharge voltage $V_d$ is applied between the cathode electrodes 11a and 11b and the anode electrode 12. By introducing an argon gas into the ion source 1 via a pipe 15 and causing a magnetic field to act in the anode electrode 12 by a magnet 13, ions are generated in the anode electrode 12. The generated ions are accelerated by an acceleration electrode 14 to which an acceleration voltage $V_a$ is applied, and are emitted from the ion source 1 as the ion beam.

The discharge voltage $V_d$ and the acceleration voltage $V_a$ are generated by a power supply unit 40. Further, the power supply unit 40 includes ammeters, an ammeter 41 measures a discharge current, and an ammeter 42 measures an ion beam current received by the conductive material 4. Values of the discharge voltage $V_d$ and the acceleration voltage $V_a$ are set by a control unit 45.

Further, the ion source 1 is fixed to a support unit 16 of the ion source position adjustment mechanism 5, and the position of the ion source 1 can be finely adjusted by an ion source movement mechanism 17 that can independently move the support unit 16 in the X direction, the Y direction, and the Z direction.

The power supply unit 40, the ion source movement mechanism 17, and the sample stage rotation drive source 3 are connected to the control unit 45, and the control unit 45 sets an ion beam emission condition, and adjusts the ion source and processes the sample according to a predetermined flow. Further, the control unit 45 is connected to a display unit 46. The display unit 46 functions as a user interface from the operator to the control unit 45, and also displays sensing data which indicates an operation state of the ion milling device and is collected by the control unit 45. For example, the sensing data displayed on the display unit 46 includes a discharge voltage value $V_d$, an discharge current value, or an acceleration voltage value $V_a$ from the power supply unit 40.

FIG. 5 shows an adjustment flow of the ion source 1 performed by the control unit 45 in the ion milling device shown in FIG. 4.

Step S51: the control unit 45 starts the rotation of the sample stage 2 by the sample stage rotation drive source 3. As shown in FIG. 4, the sample stage 2 is provided such that a surface of the conductive material 4 is perpendicular to the ion beam emitted from the ion source 1. By rotating the sample stage 2, detection unevenness of the current caused by the conductive material 4 can be prevented.

Step S52: the control unit 45 controls the power supply unit to irradiate the conductive material 4 with the ion beam from the ion source 1. At this time, the discharge voltage $V_d$ and the acceleration voltage $V_a$ applied by the power supply unit 40 to the ion source 1 are in accordance with a voltage application condition applied when the sample is actually processed. Accordingly, the ion beam when the sample is processed can be accurately reproduced.

Step S53: the ion beam current is measured by the ammeter 42. The control unit 45 acquires the ion beam current value measured by the ammeter 42.

Step S54: the control unit 45 controls the ion source position adjustment mechanism 5 such that the measured ion beam current value satisfies a predetermined reference. Herein, the ion source movement mechanism 17 of the ion source position adjustment mechanism 5 is motor-driven by the control unit 45, and is first moved in the X direction and then in the Y direction to adjust the position of the ion source 1 on the XY plane to a position where the ion beam current value is maximum. Thereafter, the position of the ion beam center $B_0$ of the ion source 1 on the XY plane and the operating distance (position in the Z direction) of the ion source 1 are finely adjusted based on a value of the ion beam current value by a movement in the Z direction as necessary. The adjustment example is an example, and the position of the ion beam center $B_0$ of the ion source 1 on the XY plane and the operating distance (position in the Z direction) of the ion source 1 can be finely adjusted in accordance with an algorithm provided in the control unit 45.

For example, the discharge voltage value $V_d$ applied to the ion source 1 may be adjusted instead of the fine adjustment in the Z direction by the ion source position adjustment mechanism 5, or in addition to the fine adjustment in the Z direction. Further, a target ion beam current value when the ion source 1 is adjusted is not limited to the maximum value of the ion beam current, and may be determined, for example, as an ion beam current value when previous processing is performed.

In the sample stage 2, the target plate 30 having different shapes of the conductive material 4 or the conductive material 4 having different shapes with respect to the target plate 30 can be replaced. For example, FIG. 6A shows an example in which a conductive material 60 having a circular shape centered on the rotation center $R_0$ is disposed as the conductive material. Further, it is also preferable to use a target plate provided with concentric conductive materials having a plurality of diameters in the same circular shape. Accordingly, the ion source can be adjusted using a conductive material having a detection range corresponding to the diameter of the ion beam. For example, as the diameter of the conductive material 4, a conductive material having a diameter smaller than the diameter of the ion beam emitted to the target plate is used, and it is also possible to make the adjustment for finely moving the ion source 1 in the Z direction such that the ion beam current value detected by the conductive material 4 is the maximum value.

On the other hand, FIG. 6B shows an example in which a conductive material 61 having a circular shape and a conductive material 62 having a annular shape and a diameter larger than the conductive material 61 are disposed as the conductive material concentrically around the rotation center $R_0$. At this time, an ion beam current value detected by the conductive material 61 and an ion beam current value detected by the conductive material 62 can be independently measured by the power supply unit 40. Specifically, the sample stage 2 is provided with two series of ion beam current extraction units corresponding to the conductive material 61 and the conductive material 62, and each of the ion beam current values is measured by the power supply unit 40. Accordingly, evaluation can be performed including an emitted ion beam profile (spreading degree of the ion beam that can approximate binomial distribution), and it is possible to improve the processing accuracy of the ion milling device or the reproducibility accuracy of the shape of the processed surface.

The ion milling device in the first embodiment has been described with particular emphasis on the position adjustment of the ion source, whereas various modifications can be made. For example, the control unit 45 may only display the ion beam current value measured by the ammeter 42 on the display unit 46, and the operator may manually adjust a movement amount of the ion source movement mechanism 17 of the ion source position adjustment mechanism 5 or the discharge voltage $V_d$ of the ion source 1 while checking the ion beam current value displayed on the display unit 46.

Second Embodiment

FIG. 7 is a configuration diagram of main parts of an ion milling device according to a second embodiment. In the second embodiment, the ion beam center $B_0$ and the rotation center $R_0$ can be aligned with a simpler mechanism. Herein, the same components as those of the first embodiment are denoted by the same reference numerals, and repetitive description thereof will be omitted.

An observation microscope (optical microscope) 73 is provided above the sample chamber 6, and the sample placing surface of the sample stage 2 can be observed from the observation window 7. Further, a mirror surface member 71 is provided on the sample placing surface of the sample stage 2. The mirror surface member may be any member that can reflect plasma emission of the ion source 1, and may be, for example, a wafer in addition to a general mirror. The mirror surface member may be mounted on the sample placing plate of the sample stage instead of the sample. The sample stage 2 includes an inclining mechanism, and can be inclined in the C direction about an axis 72 extending in the X direction. The axis 72 is located at a position crossing the rotation center $R_0$ on the sample placing surface of the sample stage 2. FIG. 7 shows a state where the sample stage 2 is inclined at an inclination angle T. The inclination angle T is defined as an angle between the ion beam center $B_0$ and a normal to the sample placing surface of the sample stage 2.

A method of performing position adjustment of the ion source 1 in the ion milling device having such a configuration will be described with reference to FIG. 8.

Step S81: the sample stage 2 is inclined at an inclination angle T of 45° with respect to the ion beam center $B_0$. Herein, since the inclining mechanism of the sample stage 2 inclines around the axis 72, when the ion beam center $B_0$ matches the rotation center $R_0$, even if the inclination of the sample stage 2 is changed, a distance from the ion source 1 does not change. Therefore, there is no problem even if the inclination angle T is a desired inclination angle other than 45° when the sample is processed.

Step S82: rotation of the sample stage 2 is started by the sample stage rotation drive source 3.

Step S83: the ion beam is emitted from the ion source 1 to the mirror surface member 71. At this time, the discharge voltage $V_d$ and the acceleration voltage $V_a$ applied by the power supply unit 40 to the ion source 1 are in accordance with a voltage application condition applied when the sample is actually processed. Accordingly, the ion beam when the sample is processed can be accurately reproduced.

Step S84: the mirror surface member 71 is observed with the observation microscope 73, and a center position of plasma emission luminance emitted from an emission port of the ion source 1 is checked. When the ion beam center $B_0$ matches the rotation center $R_0$, the vicinity of the rotation center $R_0$ of the mirror surface member 71 shines in a dot shape or a circular shape, and when the ion beam center $B_0$ does not match the rotation center $R_0$, since the sample stage 2 is rotating, the vicinity of the rotation center $R_0$ shines in an annular shape.

Step S85: the position of the ion source 1 is finely adjusted by the ion source position adjustment mechanism 5 such that the emission luminance center position of the ion source 1 checked in step S84 matches the rotation center $R_0$ of the sample stage 2.

In the above example, the mirror surface member 71 is described as being provided on the sample stage 2. Alternatively, a light emitting member that emits light by emission of the ion beam, for example, a laser light emission element, or a sample coated with a phosphor may be provided, whereby a similar effect can also be obtained.

REFERENCE SIGN LIST 1, 21 ion source
2, 22 sample stage
3, 23 sample stage rotation drive source
4, 60, 61, 62 conductive material
5 ion source position adjustment mechanism
6 sample chamber
7 observation window
11a, 11b cathode electrode
12 anode electrode
13 magnet
14 acceleration electrode
15 pipe
16 support unit
17 ion source movement mechanism
20 sample
30 target plate
31 conductive material connection plate
32 insulating material
33 rotating shaft
34 rotating gear
35 rotation contact
36 beam current detection wire
37 beam current detection wiring connector
40 power supply unit
41, 42 ammeter
45 control unit
46 display unit
71 mirror surface member
72 axis
73 microscope

The invention claimed is:

1. An ion milling device configured to process a sample by irradiating the sample with an unfocused ion beam, the ion milling device comprising:
   a sample chamber;
   an ion source position adjustment mechanism provided at the sample chamber;
   an ion source attached to the sample chamber via the ion source position adjustment mechanism and configured to emit the ion beam;
   a sample stage configured to rotate about a rotation center;
   a target plate provided on the sample stage and provided with a conductive material in a range including the rotation center; and
   an ammeter configured to measure an ion beam current received by the conductive material;
   wherein when a direction in which the rotation center extends when an ion beam center of the ion beam matches the rotation center is set as a Z direction, and a plane perpendicular to the Z direction is set as an XY plane, the ion source position adjustment mechanism is capable of adjusting a position of the ion source on the XY plane and a position of the ion source in the Z direction.

2. The ion milling device according to claim 1, wherein the conductive material has a circular shape centered on the rotation center.

3. The ion milling device according to claim 1, wherein the conductive material includes a first conductive material having a circular shape and a second conductive material having an annular shape and a diameter larger than that of the first conductive material, which are concentrically disposed about the rotation center, and
   an ion beam current received by the first conductive material and an ion beam current received by the second conductive material are independently measured.

4. The ion milling device according to claim 1, further comprising:
   a power supply unit configured to apply a predetermined voltage to the ion source;
   a control unit; and
   a display unit, wherein
   the control unit collects sensing data including a discharge voltage value, a discharge current value, and an acceleration voltage value applied to the ion source by the power supply unit, and an ion beam current value measured by the ammeter and displays the sensing data on the display unit.

5. The ion milling device according to claim 1, further comprising:
   a power supply unit configured to apply a predetermined voltage to the ion source; and
   a control unit, wherein
   the control unit adjusts the position of the ion source on the XY plane and the position of the ion source in the Z direction by the ion source position adjustment mechanism based on an ion beam current value measured by the ammeter.

6. The ion milling device according to claim 5, wherein the control unit adjusts a discharge voltage applied by the power supply unit to the ion source instead of adjusting the position in the Z direction by the ion source position adjustment mechanism, or in addition to adjusting the position in the Z direction by the ion source position adjustment mechanism.

7. An ion source adjusting method for an ion milling device configured to process a sample placed in a sample chamber by irradiating the sample with an unfocused ion beam, the method comprising:
   rotating, by a sample stage rotation drive source, a sample stage, on which a target plate provided with a conductive material in a range including a rotation center is provided, around the rotation center;
   irradiating, by an ion source, the target plate with the ion beam; and measuring, by an ammeter, an ion beam current received by the conductive material, wherein the ion source is attached to the sample chamber via an ion source position adjustment mechanism that is capable of adjusting a position of the ion source, and the position of the ion source adjusted by the ion source position adjustment mechanism is set such that the ion beam current value measured by the ammeter satisfies a predetermined target.

8. The ion source adjusting method according to claim 7, wherein when a direction in which the rotation center extends when an ion beam center of the ion beam and the rotation center match is set as a Z direction, and a plane perpendicular to the Z direction is set as an XY plane, the position of the ion source adjusted by the ion source position adjustment mechanism includes a position of the ion source on the XY plane and a position of the ion source in the Z direction.

9. The ion source adjusting method according to claim 7, wherein a value of a discharge voltage of the ion source is set such that the ion beam current value measured by the ammeter satisfies the predetermined target.

10. The ion source adjusting method according to claim 7, wherein an emission condition of the ion source when the target plate is irradiated with the ion beam is equal to an emission condition of the ion source when the sample is processed.

11. The ion source adjusting method according to claim 7, wherein a maximum value of the ion beam current or an ion beam current value when performing a previous processing is set as the predetermined target.

12. An ion source adjusting method for an ion milling device configured to process a sample placed in a sample chamber by irradiating the sample with an unfocused ion beam, the method comprising:

rotating, by a sample stage rotation drive source, a sample stage, on which a mirror surface member is provided in a range including a rotation center around the rotation center in a state where the sample stage is inclined at an inclination angle of 45°; and irradiating, by an ion source, the mirror surface member with the ion beam, wherein the ion source is attached to the sample chamber via an ion source position adjustment mechanism that is capable of adjusting a position of the ion source, and the position of the ion source adjusted by the ion source position adjustment mechanism is set such that the vicinity of the rotation center in the mirror surface member shines in a dot shape or a circular shape.

13. The ion source adjusting method according to claim 12, wherein instead of the mirror surface member, a light emitting member that emits light in response to the ion beam is provided on the sample stage.

14. The ion source adjusting method according to claim 13, wherein an emission condition of the ion source when the light emitting member is irradiated with the ion beam is equal to an emission condition of the ion source when the sample is processed.

15. The ion source adjusting method according to claim 12, wherein an emission condition of the ion source when the mirror surface member is irradiated with the ion beam is equal to an emission condition of the ion source when the sample is processed.

* * * * *